(12) United States Patent
Smits et al.

(10) Patent No.: US 9,224,580 B2
(45) Date of Patent: Dec. 29, 2015

(54) PLASMA GENERATOR

(71) Applicant: MAPPER LITHOGRAPHY IP B.V., Delft (NL)

(72) Inventors: Marc Smits, Pijnacker (NL); Chris Franciscus Jessica Lodewijk, Delft (NL)

(73) Assignee: MAPPER LITOHGRAPHY IP B.V., Delft (NL)

( * ) Notice: Subject to any disclaimer, the term of this patent is extended or adjusted under 35 U.S.C. 154(b) by 0 days.

(21) Appl. No.: 14/348,062

(22) PCT Filed: Sep. 28, 2012

(86) PCT No.: PCT/EP2012/069226
§ 371 (c)(1),
(2) Date: Mar. 28, 2014

(87) PCT Pub. No.: WO2013/045636
PCT Pub. Date: Apr. 4, 2013

(65) Prior Publication Data
US 2014/0231667 A1    Aug. 21, 2014

Related U.S. Application Data

(60) Provisional application No. 61/540,396, filed on Sep. 28, 2011, provisional application No. 61/637,651, filed on Apr. 24, 2012, provisional application No. 61/648,123, filed on May 17, 2012.

(51) Int. Cl.
*H01J 37/10* (2006.01)
*H01J 37/32* (2006.01)
*H05H 1/30* (2006.01)
(Continued)

(52) U.S. Cl.
CPC ....... *H01J 37/32082* (2013.01); *H01J 37/3002* (2013.01); *H01J 37/32862* (2013.01); *H05H 1/30* (2013.01); *H05H 1/46* (2013.01); *H05H 2001/4667* (2013.01); *H05H 2001/4675* (2013.01); *H05H 2001/4682* (2013.01)

(58) Field of Classification Search
USPC .............. 250/396 R, 492.2, 398; 219/121.52; 315/111.51
See application file for complete search history.

(56) References Cited

U.S. PATENT DOCUMENTS 6,297,595 B1 * 10/2001 Stimson et al. .......... 315/111.51
6,897,458 B2 * 5/2005 Wieland et al. ............ 250/494.1
(Continued)

FOREIGN PATENT DOCUMENTS

GB        1 222 243 A      2/1971
WO    WO 2009 090012 A1    7/2009

*Primary Examiner* — Phillip A Johnston
*Assistant Examiner* — Hsien Tsai
(74) *Attorney, Agent, or Firm* — Hoyng Rock Monegier LLP; David P. Owen

(57) ABSTRACT

An arrangement for generating plasma, the arrangement comprising a primary plasma source (1) comprising a primary source chamber (15) and a first coil (4) for generating plasma in the primary source chamber, a secondary plasma source (25) comprising a secondary source chamber (16) and a second coil (26) for enhancing plasma generated by the primary plasma source and/or generating plasma in the secondary source chamber generating plasma in the primary source chamber, a hollow guiding body (11) arranged for guiding at least a portion of the plasma generated by the primary plasma source to the secondary plasma source, and an outlet (14) for emitting at least a portion of the plasma generated by the arrangement.

19 Claims, 4 Drawing Sheets

(51) Int. Cl.
   *H05H 1/46*      (2006.01)
   *H01J 37/30*     (2006.01)

(56) References Cited

U.S. PATENT DOCUMENTS

| | | |
|---|---|---|
| 6,958,804 B2 | 10/2005 | Wieland et al. |
| 7,019,908 B2 | 3/2006 | van 't Spijker et al. |
| 7,084,414 B2 | 8/2006 | Wieland et al. |
| 7,129,502 B2 | 10/2006 | Kruit |
| 8,089,056 B2 | 1/2012 | Wieland et al. |
| 8,198,602 B2 | 6/2012 | Steenbrink et al. |
| 8,445,869 B2 | 5/2013 | Wieland et al. |
| 8,502,174 B2 | 8/2013 | Wieland |
| 8,502,176 B2 | 8/2013 | Wieland et al. |
| 8,653,485 B2 | 2/2014 | Wieland et al. |
| 2007/0064213 A1 | 3/2007 | Jager et al. |
| 2007/0075051 A1 | 4/2007 | Morrisroe |
| 2009/0250340 A1 | 10/2009 | Sasaki et al. |
| 2009/0261267 A1 | 10/2009 | Wieland et al. |
| 2011/0298376 A1* | 12/2011 | Kanegae et al. ......... 315/111.51 |

* cited by examiner

PLASMA GENERATOR

BACKGROUND OF THE INVENTION

1. Field of the Invention

The invention relates to an arrangement and method for removal of contaminant deposits, and in particular to a plasma generator for removing contaminant deposits.

2. Description of the Related Art

The accuracy and reliability of charged particle lithography systems is negatively influenced by contamination. An important contribution to contamination in such lithography system is caused by the build-up of deposits of contaminants. Charged particle lithography systems generate charged particles such as electrons, and generate beams of charged particles which are focused, modulated and projected onto a wafer in the lithography process. The charged particle beams interact with hydrocarbons present in the lithography system, and the resulting Electron Beam Induced Deposition (EBID) forms a carbon-containing layer on surfaces in the system. This layer of carbon-containing material affects the stability of the charged particle beamlets. The charged particle beams and beamlets are typically formed using aperture plates, and they may also be focused and modulated by arrays of lenses and electrodes formed in aperture plates. A build-up of carbon-containing layers in and around apertures through which the charged particle beams or beamlets pass also reduces the size of the apertures and reduces transmission of beams or beamlets through these apertures. Removal of EBID, in particular in areas with relatively high hydrocarbon partial pressures and relatively high beam current densities, is therefore highly desirable.

Such deposits can be lessened or removed by atom cleaning. This may be achieved using a plasma generator to produce a stream of atomic radicals that chemically react with the deposits, forming volatile molecular compounds.

BRIEF SUMMARY OF THE INVENTION

The invention is directed to an improved plasma generator and an improved method for generating plasma. These may be of particular utility in cleaning contaminants such as EBID, and in a charged particle lithography system.

In a first aspect the invention relates to an arrangement for generating plasma, the arrangement comprising a primary plasma source arranged for generating plasma, a hollow guiding body arranged for guiding at least a portion of the plasma or components thereof (e.g. atomic radicals) generated by the primary plasma source to a secondary plasma source, and an outlet for emitting at least a portion of the plasma from the arrangement. The primary plasma source may comprise a primary source chamber in which the plasma may be formed and a first coil for generating the plasma in the primary source chamber, the chamber comprising an inlet for receiving an input gas, and one or more outlets for removal of at least a portion of the plasma from the source chamber and into the guiding body. The secondary plasma source may comprise a secondary source chamber occupying at least a portion of the guiding body. This dual plasma source design enables the plasma generator to have two smaller and lower power plasma sources due to the interaction between the two sources.

The secondary plasma source in some embodiments does not include a coil for enhancing or generating plasma. Plasma flows from the primary plasma source and is enhanced and/or a secondary plasma is generated. The secondary plasma source may comprise a secondary source chamber and the arrangement may be adapted to generate a high brightness plasma in the secondary source chamber. The primary plasma source may comprise a primary source chamber and the secondary plasma source may comprise a secondary source chamber, and the arrangement may be adapted to generate a relatively low brightness plasma in the primary source chamber and a relatively high brightness plasma in the secondary source chamber.

In some embodiments, the secondary plasma source may comprise a second coil arranged for enhancing plasma generated by the primary plasma source and/or generating plasma. The primary plasma source may comprise a primary source chamber and a first coil arranged for generating plasma therein, and the secondary plasma source may comprise a secondary source chamber and a second coil arranged for enhancing plasma generated by the primary plasma source and/or generating plasma in the secondary source chamber.

The first coil of the primary plasma source and the second coil of the secondary plasma source may be RF coils arranged to operate at a radio frequency voltage. The secondary plasma source may be arranged for operation at a lower power than the primary plasma source. The arrangement may further comprise a first power supply for supplying a first radio frequency voltage to the first coil of the primary plasma source and a second power supply for supplying a second radio frequency voltage to the second coil of the secondary plasma source, and wherein the first voltage is higher than the second voltage. In operation, the primary plasma source may be arranged to operate with an input power level being not more than 50% higher than the input power level required to generate enough plasma in the primary plasma source to stabilize the formation of plasma by the secondary plasma source. The power required to operate the primary plasma source may be reduced since its function is to supply sufficient plasma to stabilize the secondary plasma source, instead of having a primary plasma source which is required to produce all of the plasma required.

The secondary plasma source may be arranged for operation with a supply power which is too small to enable stable plasma generation without a supply of plasma from the primary plasma source. The secondary plasma source may be a "micro" plasma source small enough to fit into narrow spaces. Such a small plasma source would be too small and too low power to form a stable plasma, but the influence of the primary plasma source to stabilize the secondary plasma source enables such a design.

The primary plasma source may comprise a primary source chamber in which primary plasma is generated and the secondary plasma source may comprise a secondary source chamber in which the primary plasma is enhanced and/or secondary plasma is generated, the primary source chamber being larger than the secondary source chamber. The primary source chamber may have a larger cross-section than the secondary source chamber, and may have a greater internal volume. The larger primary source chamber can then be located further from the outlet than the secondary source chamber, allowing constructions where the smaller secondary source chamber can fit into narrow restricted spaces close to the site to be cleaned.

The arrangement may further comprise a pressure regulator for regulating pressure in the primary source chamber, and a flow or pressure restriction may be provided between the primary and secondary source chambers. The restriction may be adapted to maintain an operating pressure in the secondary source chamber at a lower pressure than in the primary source chamber. The arrangement may also be adapted for regulating the pressure in the secondary source chamber, or for regulating the pressure in both the primary and secondary source chambers.

The secondary source chamber may have a length longer than the primary source chamber in a direction of the flow of plasma from the primary source chamber.

The secondary source chamber may be arranged to generate plasma at a position close to an outlet of the arrangement, and the primary plasma source may be located further from the outlet than the secondary plasma source. This results in a design with a secondary plasma chamber closer to the outlet where the plasma is emitted, so that less of the plasma generated in the secondary chamber is lost by decay and other processes during transfer to the outlet.

In operation, at least a portion of the plasma generated by the primary plasma source may travel through the guiding body to the secondary plasma source to stabilize the formation of plasma by the secondary plasma source. In operation, the primary plasma source may be capacitively coupled to the secondary plasma source via the plasma generated by the primary plasma source and/or the secondary plasma source. The arrangement may further comprise an electrode located near the outlet of the arrangement. The electrode may be maintained at a fixed potential with respect to a voltage supplied to primary plasma source and/or the secondary plasma source, and it may be grounded with respect to a voltage supplied to primary plasma source and/or the secondary plasma source.

The hollow guiding body may comprise a funnel section located at the outlet of the primary plasma source arranged for guiding plasma generated by primary plasma source into the guiding body. The guiding body may comprise a quartz material or an inner surface comprising a quartz material, and the guiding body may be in the form of a tube or duct. The guiding body may have a bend or elbow to direct plasma from the outlet onto an area to be cleaned by the plasma.

The primary plasma source may comprise a primary source chamber in which the plasma may be formed, and an aperture plate positioned between the primary source chamber and the guiding body, the aperture plate having one or more apertures for permitting flow of the plasma from the primary source chamber into the guiding body. The arrangement may further comprise an aperture plate at or near the outlet of the guiding body to confine at least a portion of the plasma in the guiding body from exiting through the outlet.

The primary plasma source may comprise a primary source chamber in which the plasma may be formed, the primary source chamber being provided with a pressure regulator for regulating pressure in the primary source chamber, and wherein a flow or pressure restriction is provided between the primary source chamber and the guiding body. The restriction may be adapted to maintain the operating pressure in the guiding body at a lower pressure than in the primary source chamber.

In another aspect the invention relates to a method for generating a plasma, comprising flowing an input gas into a primary source chamber, energizing a first coil to form a primary plasma in the primary source chamber, flowing at least a portion of the primary plasma into a secondary source chamber, and generating a secondary plasma in the secondary source chamber. The step of flowing the primary plasma into the secondary source chamber may comprise flowing the plasma into a guiding body, at least a portion of the guiding body forming the secondary source chamber. The first plasma may be flowed from the primary source chamber through a restriction into a secondary source chamber.

The secondary source chamber may omit a coil for forming a plasma. The method may further comprising regulating pressure in the primary source chamber and the secondary source chamber, and the step of regulating the pressure may comprise maintaining a lower pressure in the secondary source chamber than in the primary source chamber. The primary plasma may be a relatively low brightness plasma and the secondary plasma may be a relatively high brightness plasma.

The method may further comprise energizing a second coil to enhance the primary plasma flowing from the primary source chamber and/or generate a secondary plasma in the secondary source chamber. The second coil may be energized at a lower power than the first coil, and the secondary source chamber may be smaller than the primary source chamber.

The method may further comprise stabilizing the formation of plasma in the secondary source chamber with the primary plasma flowing from the primary source chamber, and may further comprise maintaining a lower pressure in the secondary source chamber than in the primary source chamber.

In another aspect the invention relates to a cleaning apparatus for cleaning contaminants from a surface, the apparatus comprising an arrangement for generating plasma as described herein, and means for directing the plasma onto the surface to be cleaned.

In yet another aspect the invention relates to a charged particle lithography machine, comprising a beamlet generator for generating a plurality of charged particle beamlets and a plurality of beamlet manipulator elements for manipulating the beamlets, each beamlet manipulator element comprising a plurality of apertures through which the beamlets pass, the machine further comprising an arrangement for generating plasma as described herein, adapted to generate plasma and direct the plasma onto a surface of one or more of the beamlet manipulator elements.

BRIEF DESCRIPTION OF THE DRAWINGS

Embodiments of the invention will now be described, by way of example only, with reference to the accompanying schematic drawings in which.

DESCRIPTION OF ILLUSTRATIVE EMBODIMENTS

The following describes certain embodiments of the invention, given by way of example only and with reference to the figures.

Figure 1:
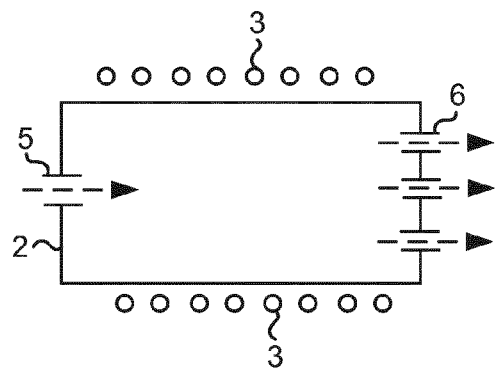
FIG. 1 is a schematic diagram of an embodiment of a radio frequency (RF) plasma generator.

FIG. 1 shows a radio frequency (RF) plasma generator comprising a chamber 2 with an RF coil 4 around the outside of the chamber. An input gas such as oxygen or hydrogen or other suitable gas is passed into the chamber via inlet 5 and the coil 4 is energized with an RF voltage to produce a plasma including radicals, such as oxygen atom radicals, which exit the chamber via one or more outlets 6. In the following description, except where the context indicates otherwise, the term plasma is used for simplicity to denote a plasma and/or radicals produced in such a plasma generator.

Contaminants such as electron beam induced deposition (EBID), generally comprising carbon containing compounds, form on surfaces in a charged particle lithography system, such as the surfaces of beamlet manipulator elements (such as beamlet modulators, deflectors, lenses, aperture arrays, beam stop arrays, etc.). For removing contaminants such as EBID deposits, radicals, such as oxygen atom radicals, may be used, reacting with carbon in the EBID deposits to form carbon monoxide. Plasma typically comprises a mixture of gas molecules, ions, electrons, and atomic radicals. For cleaning EBID deposits, atomic ions may also be used. However, due to their electrical charge, ions may be accelerated by electric fields generated in or around the plasma generator system, and have sufficient kinetic energy to sputter the surface to be cleaned. This can result in removing not just the contaminant deposits, but also part of the surface underlying the deposits, so damaging the surface. Uncharged radicals generally have a lower kinetic energy. i.e. the thermal energy of the radicals, and are more suitable in many cleaning applications for this reason.

Excellent cleaning rates of greater than 5 micron per hour can be achieved by atomic radical cleaning where there is a direct view from the plasma generator source to the contaminated area to be cleaned. However, this method cannot be easily implemented in situations where the deposits are formed on surfaces with cannot be easily accessed and in which there is little room to locate the plasma generator with a direct line from the source to the area to be cleaned. The beam stop array and beamlet aperture array are areas that exhibit these problems, typically having a restricted space available above the surface of the beam stop of 5 mm of less. Typically, plasma sources are constructed with a long tube of length 20 cm or more and a diameter of about 10 cm.

For example, for cleaning the beam stop array and beamlet aperture array in a charged particle lithography system there is typically very limited space (e.g. about $10 \times 10 \times 10$ mm$^3$) available to implement a plasma source in the vicinity of these elements. The problem in designing a miniature plasma source for use in locations with very restricted space lies in the aspect ratio of the area to volume of the plasma generator. For a large plasma source this ratio is small, but as the size of the plasma source is reduced the ratio increases. This results in minor instabilities coupling into or out of the plasma in the source chamber via its surface, having an increasingly large effect. As a consequence, the plasma may be hard to ignite and easily extinguished due to these instabilities.

Instead, a much larger source may be used (e.g. about $100 \times 100 \times 100$ mm$^3$) to be situated at approximately 200 mm from the elements to be cleaned. The plasma radicals must then be transported from the plasma generator to the site of the cleaning.

The present invention provides a plasma generator which permits direct access to the contaminated area even where only a limited volume is available at the cleaning site to locate the cleaning apparatus. A plasma source is placed near the contaminated area to be cleaned, and a guiding path is attached to the plasma generator and the plasma radicals produced are transported towards the area to be cleaned.

Figure 2A:
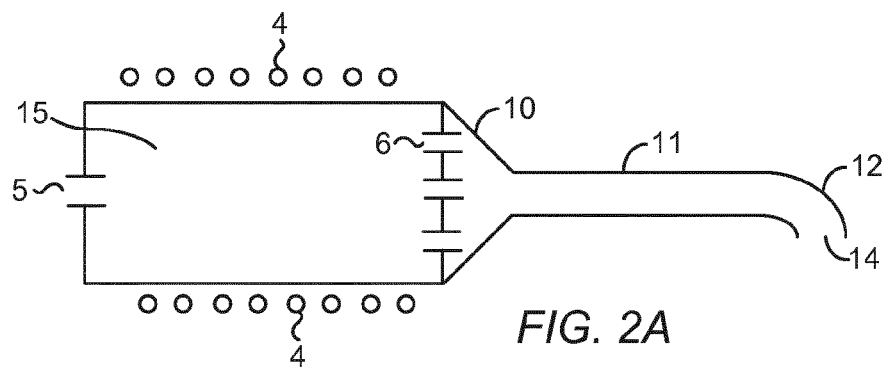
FIGS. 2A, 2B and 2C are schematic diagrams of an embodiment of a plasma generator including a guiding body.
Figure 2B:
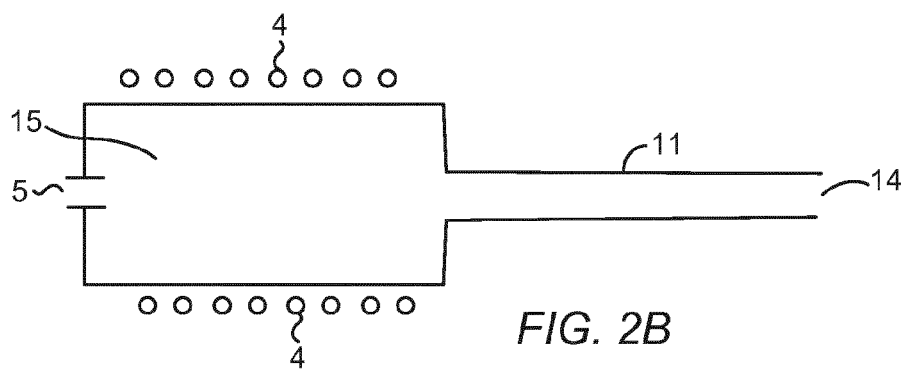
Figure 2C:
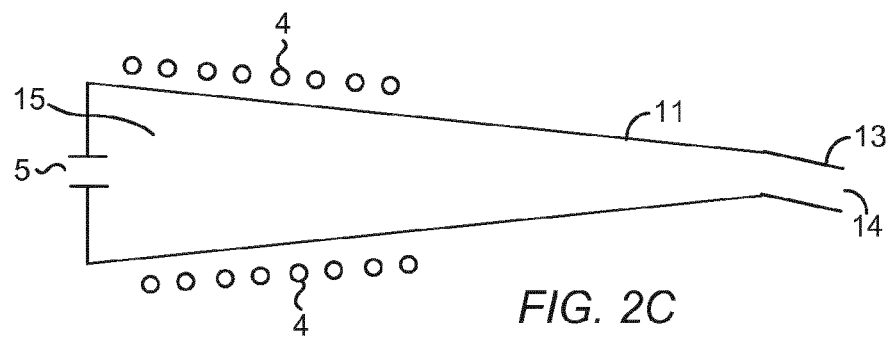

FIGS. 2A, 2B and 2C schematically show arrangements for removal of contaminant deposits, in particular for removal of contaminants deposited on surfaces that are located in areas with restricted or difficult access. The arrangements comprise a plasma generator similar to that shown in FIG. 1, further referred to as the primary source chamber 15, which functions as a primary plasma source 1. The arrangement further comprises a hollow guiding body 11, such as tube or duct, for guiding plasma towards a predetermined destination area. It will be recognized that various configurations are possible, and three possible configurations are shown, and features of any of these embodiments may be used in any of the other embodiments. The arrangement in FIG. 2A the guiding body 11 includes a funnel portion 10 where the guiding body 11 is coupled to the primary source chamber 15, and the chamber end wall with outlets 6 function as an aperture plate to permit the plasma and radicals to enter the guiding body 11 from the chamber 15. The guiding body 11 includes an elbow 12 near the end of the guiding body to direct plasma exiting the guiding body. The arrangement in FIG. 2B omits the funnel portion, the chamber end wall, and the elbow, so that a straight guiding body 11 having a smaller cross section than the primary source chamber 15 is coupled directly to the primary source chamber 15. The arrangement in FIG. 2C features a continuous hollow body, a wider portion forming the primary source chamber 15 and a narrower portion forming the guiding body 11. A hollow body having a uniform cross section may also be used, one portion of the hollow body functioning as the primary source chamber 15 and another portion functioning as the guiding body 11.

The guiding body 11 may be straight or may comprise one or more bends such as an elbow 12 or bend 13 to direct the plasma in a desired direction. Preferably, the guiding body 11 is as straight as possible to increase the average lifetime of radicals being transferred through the tube. The guiding body has an outlet 14 which may be located in close proximity of the contaminant deposit to be reduced or removed. Typically, the outlet 14 is in direct contact with a vacuum environment.

The plasma and radicals generated in primary source chamber 15 of primary source 1 are guided towards the contaminant deposit to be reduced or removed via the guiding body 11. The guiding body 11 may be made of quartz, or with inner surface coated with quartz, to suppress extinction of the radicals when they interact with these parts of the device. Embodiments of the invention are described herein with reference to plasma formed from oxygen. However, it will be understood that the invention may also employ plasmas from other gases, such as hydrogen or nitrogen.

Figure 3:
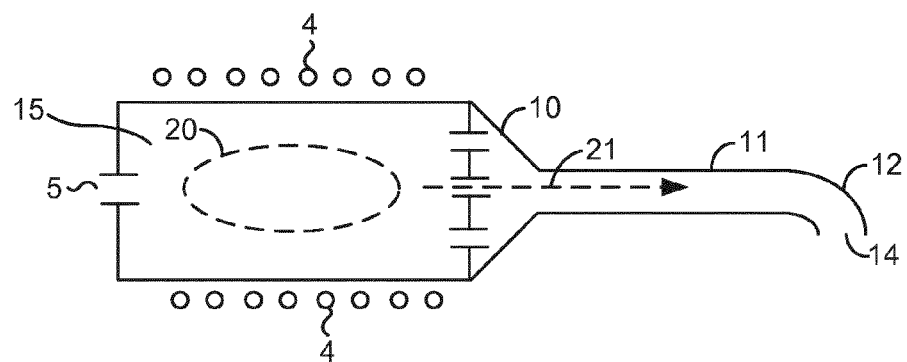
FIG. 3 is a schematic diagram of the embodiment of FIG. 2 in operation.

FIG. 3 shows the arrangement of FIG. 2A in operation. It will be understood that arrangements shown in FIGS. 2B and 2C may also be operated in a similar manner. Oxygen is supplied to the primary source chamber 15 and RF coil 4 is energized to inductively heat the oxygen, and a plasma 20 is generated in primary source chamber 15. The oxygen pressure may be adjusted, for example, to produce a relatively high pressure in the chamber 15. The plasma 20, and in particular radicals produced therein, may exit the primary source chamber 15 as schematically represented by dashed arrow 21 and flow into the guiding body 11.

Major losses of radicals are typically observed in these arrangements during transport from the primary source chamber 15 to the outlet 14 at the site where the cleaning is to take place. Several processes will cause annihilation of the atomic radicals, such as volume recombination, surface adsorption and surface recombination. The losses of such a system are significant, e.g. using power of 600 W for the source chamber, the efficiency of transport of the radicals is only 0.4%. The losses in the guiding body 11 can be compensated by using a more intense plasma source, but the thermal load caused by using such high power for the plasma generator becomes a serious problem for many applications, particularly when used in a vacuum environment as required for lithography applications. By carefully designing the pressure and temperature of the primary source chamber and guiding body, the losses can be minimized.

The plasma generator may also be made more effective by more efficient transport of plasma through the guiding body 11, and generation of plasma in the guiding body 11 so that the guiding body is not merely conveying plasma formed in the primary source chamber 15, but additional plasma is formed in the guiding body, close to the location where it is needed for cleaning. In this case a secondary plasma source 25 is formed, with a portion of the guiding body functioning as a secondary source chamber 16.

This may be accomplished in different ways. By adjusting pressure in the primary source chamber and pressure in the guiding body relative to the surrounding environment, plasma may be guided from the primary source chamber 15 into the guiding body 11 and through the guiding body to the outlet 14. The pressure should preferably decrease from the primary source chamber 15 to the guiding body 11 and to the environment outside the outlet 14 in order to promote flow of plasma from the chamber 15 to the outlet 14. Depending on the plasma formation, the pressure can be optimized through the device, e.g. by use of aperture plates (such as aperture plate 31 at the entrance to the guiding body 11 and aperture plate 32 at the outlet 14) and/or by adjusting the relative sizes and geometry of the primary source chamber 15, guiding body 11 and the outlet 14.

By adjusting pressures in the primary source chamber 15 and in the guiding body 11, plasma can be formed in the guiding body. The pressures may be adjusted to obtain conditions where a high brightness plasma is formed in the guiding body at a relatively lower pressure than the primary source chamber. This results in the formation of plasma in the guiding body closer to the location where it is needed to produce more effective cleaning.

The pressure in the guiding body 11 may be relatively low in comparison to the primary source chamber 15, depending on the geometry of the tube and size of the outlet 14, and the ambient pressure of the surrounding environment. A relatively high pressure in the primary source chamber 15 will displace more plasma into the guiding body 11, thus shortening the path for the radicals to reach the outlet 14 and the cleaning site, and thus reducing the loss of radicals due to recombination and other effects, and thereby increasing the cleaning rate.

In a lithography machine cleaning application, the ambient pressure may be low inside the lithography machine vacuum chamber, e.g. $10^{-3}$ millibar or lower. The pressure in the guiding body 11 may be higher, e.g. $10^{-2}$ millibar, but lower than the pressure in the primary plasma chamber 15, aiding the formation of plasma in the guiding body itself, even though there is no RF coil around the guiding body. This may be due to the relatively lower pressure in the guiding body 11 and may be assisted by the flow of plasma from the primary source chamber 15, conveying the effect of the RF coil at the primary source chamber, e.g. by capacitive coupling, into the guiding body. Plasma is an electrical conductor, and thus may conduct the radio frequency current from the RF coils 4 surrounding the primary source chamber 15 into the guiding body 11 where it may generate more plasma.

Figure 4:
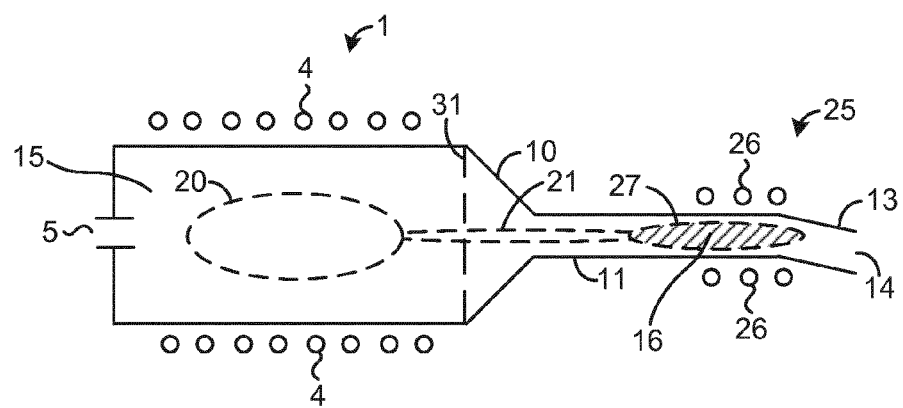
FIG. 4 is a schematic diagram of an embodiment including a secondary plasma source.

An "active" secondary plasma source 25 may be included near and plasma outlet 14. FIGS. 4-5B show arrangements similar to FIGS. 2A-2C but including a secondary plasma source 25 comprising an RF coil 26 placed around at least a portion of the guiding body 11 near to the plasma outlet 14. The RF coil 26 may be energized with an RF voltage to generate secondary plasma 27 in an area functioning as a secondary source chamber 16 in the guiding body 11. The secondary source chamber 16 may occupy some or all of the guiding body 11 or may be constructed as a separate body adjoining the guiding body.

In this embodiment, the larger primary plasma source 1 is located distant from the outlet 14 and cleaning site, and the primary plasma 20 from the primary plasma source 1 flows into the guiding body 11 towards the secondary plasma source 25. The plasma 21 flowing into the guiding body 11 acts as a "seed" plasma to enhance formation of a secondary plasma 27 in the secondary source 25. The secondary source 25 may be much smaller than the primary source and require much lower power, and may comprise a miniature coil 26 around the tube or duct 11. Applying an RF voltage to this secondary coil 26 acts to enhance the decaying plasma 21 from the primary source 1. The secondary plasma source 25 may be too small to achieve stable plasma generation. However, the larger primary plasma source 1 operating at higher power can provide stable delivery of plasma 21 through the guiding body 11 to the site of the secondary plasma source 25. This plasma flow from the primary source 1 will 'reignite' the secondary plasma 27 in the secondary plasma source 25 if instabilities make the plasma extinguish in the secondary plasma source 25. This effect stabilizes the secondary plasma source 25, and eliminates or reduces the need for plasma ignition by the secondary source only.

The embodiment shown in FIG. 4 employs an optional aperture plate 31 between the primary source chamber 15 and guiding body 11 at the exit of the primary source. The gas flow conductance of the aperture plate 31 can be adjusted (by adjusting the number and size of the apertures in the plate) to adjust the relative pressures in the source chamber 15 and guiding body 11. The aperture plate 31 also operates to partly confine the plasma in the primary source chamber 15 by reducing the quantity of ions flowing from the chamber 15 into the guiding body 11, due partly to recombination of ions and electrons due to collisions, while permitting flow of radicals into the guiding body 11. Aperture plate 31 may be completely omitted to permit maximum flow of plasma 21 into guiding body 11.

Figure 5A:
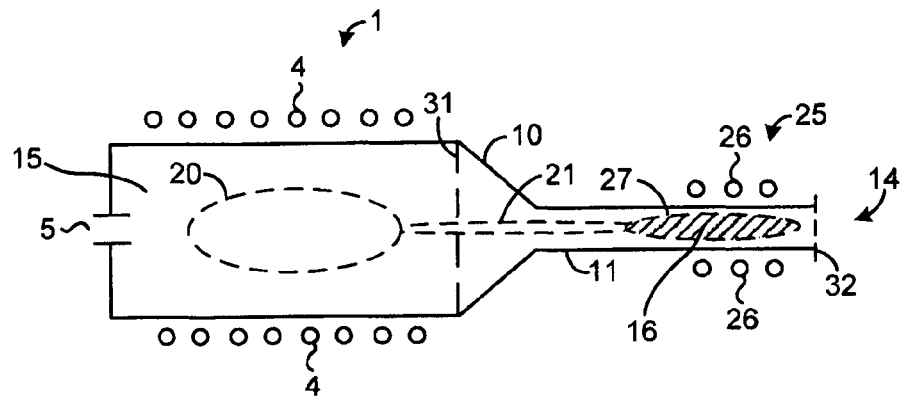
FIGS. 5A and 5B are schematic diagrams of other embodiments including a secondary plasma source.
Figure 5B:
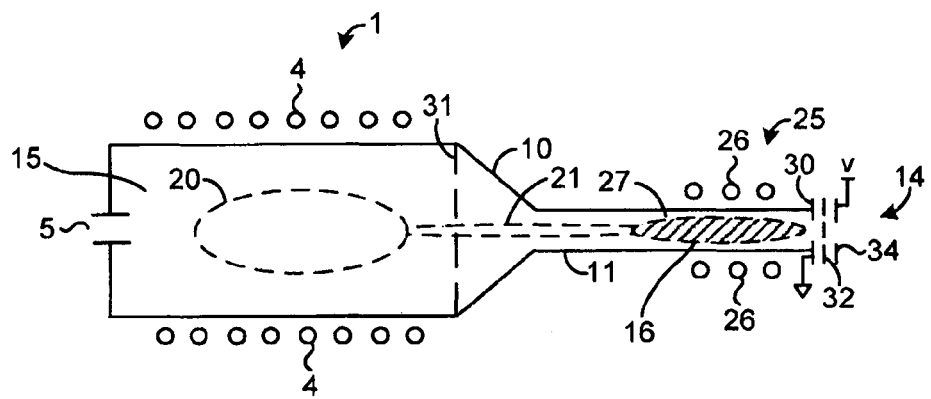

The embodiment shown in FIG. 5A also employs an optional aperture plate 32 near the end of the guiding body 11, preferably at the outlet 14. The aperture plate 32 at the secondary exit operates to confine the plasma inside the tube or duct 11, limiting the ability of high kinetic energy ions from striking the area to be cleaned. These high energy ions may sputter the top surface of the area to be cleaned and this can lead to damage of the part being cleaned. Furthermore, when both aperture plates 31 and 32 are used, the gas flow conductance of the aperture plates can be adjusted so that the pressure in both the primary source chamber 15 and the guiding body 11/secondary source chamber 16 (i.e. the location in the guiding body 11 where the RF coils 26 of the secondary plasma source coils are located) is optimal, to improve the efficiency of the plasma generator.

The aperture plates 31 and/or 32 may be made from a conducting material such as a metal, or a non-conducting material such as a plastic, ceramic or quartz. The aperture plate 32 may be made from a conducting material to function also as an electrode, which may be grounded or connected to a common voltage. Alternatively, a separate electrode 30 may be installed near the outlet 14, as shown in the embodiment of FIG. 5B, which may be grounded or connected to a common voltage.

Such an electrode 30 (or grounded aperture plate 32) near the outlet 14 may further assist to generate plasma in the guiding body 11 and/or enhance plasma flowing into the guiding body 11, through capacitive coupling. Plasma is a conductor, and as it flows from the primary source chamber 15 into the guiding body 11 to towards the electrode 30, it creates a capacitive coupling between the RF coil 4 of the primary plasma source 1 and the electrode 30 at the outlet 14 at the end of the secondary source chamber 25. The RF voltage supplied to the RF coil 4 generates an electric field between the RF coil 4 and electrode 30 which excites the plasma in the guiding body 11 between the RF coil 4 and electrode 30 which induces plasma formation in the guiding body 11. Plasma generation via such capacitive coupling is typically difficult to achieve unless the guiding body is short, i.e. short distance from the primary plasma source to the cleaning site, particularly when there is grounded metal near to the plasma generator, which is usually the case where the plasma generator is surrounded by other equipment.

However, a "hybrid" plasma generator, which uses both inductive and capacitive coupling to generate plasma as described herein, can overcome this difficulty. The system generates a primary plasma 20 in the primary source chamber 15 using inductive coupling, where a magnetic field generated by an RF current through the coil 4 induces plasma formation, and a secondary plasma 27 in the guiding body 11/second plasma chamber 16 using capacitive coupling, where an electric field is generated by an RF voltage between the coil 4 and electrode 30 induces plasma formation, and additional inductive coupling from the magnetic field generated by RF current in coil 26. The primary inductively-coupled plasma 20 can "grow" in the guiding body 11 towards the electrode 30 near the cleaning site, changing from inductively coupled to capacitively coupled, and this can operate to stabilize the plasma 27 formed in the secondary plasma chamber 16.

This process starts with a primary inductively-coupled plasma 20 that can be formed in a grounded environment, i.e. where there are grounded conductors nearby. In such a grounded environment, it is very difficult to sustain a capacitively-coupled plasma. The primary plasma in the primary source chamber 15 heats the nearby volume in the guiding body 11, partly due to flow of hot plasma 21 into the guiding body 11, and the plasma 21 grows a little more in the guiding body. The plasma is a conductor and its growth/formation in the guiding body extends the electric field from the RF coil 4 of the primary source 1 further into the guiding body 11, aiding further plasma growth/formation. This process continues until the plasma reaches the electrode 30 and stabilizes plasma formation in the small secondary plasma chamber 16.

The embodiment in FIG. 4 has a bend 13 at the end of the guiding body 11 near the outlet 14, rather than a 90 degree elbow 12, while the embodiment of FIG. 5A has a straight guiding body 11. Any of the configurations shown in any of the drawings may be used with any of the embodiments, with or without the funnel section 10 or aperture plates 31 and/or 32.

The embodiment shown in FIG. 5B employs an additional electrode 34 to further reduce the quantity of ions exiting the outlet 14 of the plasma generator and/or reduce their velocity. The additional electrode 34 may be energized with a voltage V to repel or attract the ions, e.g. a positive voltage to repel negative ions, or a voltage opposite to the voltage supplied to the RF coil 4. Note that the electrode 30, aperture plate 32, and additional electrode 34 may be used in various combinations to achieve the desired results, i.e. to extend plasma formation into the guiding body 11 while controlling the emission of energetic ions while permitting the emission of atomic radicals. These elements operate as a radical/ion filter, to let radical pass while reducing or preventing ion emission.

To reduce the thermal load of the complete plasma source arrangement on the electron optics and other parts of the lithography system, the primary plasma source 1 can be energized at a lower power, with just enough power supplied to coil 4 to generate sufficient primary plasma flow to stabilize the secondary plasma in the secondary plasma source 25. The secondary plasma source can also operate at a lower power supplied to coil 26, since it is located near to the contaminated area to be cleaned, and little losses due to transport of the plasma radicals need to be compensated. The power for each plasma source may be adjusted separately to result in optimal conditions for a given application. For example, the primary plasma source 1 may be operated at a higher power while the secondary plasma source operates at a very low power, or the primary plasma source 1 may operate at a low power just sufficient to supply plasma to the secondary plasma source which operates at a higher power. However, the formation of plasma close to the location where it is needed enables the total power to be reduced as compared to previous designs.

Although including the RF coil 26 for the secondary plasma source 25 will increase the size of the guiding body 11, the very small size and low power requirements for the secondary plasma source 25 minimizes this drawback. For example, it is expected that a primary plasma source powered at 100 W and a secondary plasma source powered at approximately 2.4 W can achieve the same cleaning effect as previous designs using only a primary plasma source at 600 W, i.e. a secondary source at approximately 0.4% of the 600 W primary source of the previous design. The miniature secondary plasma source 25 may be easily upgraded to higher powers to achieve higher cleaning rates, e.g. increasing the secondary plasma source to 24 W to achieve an increase in cleaning rate by a factor 10.

This new design provides an arrangement with two plasma sources, a smaller secondary plasma source 25 located close to the plasma outlet 14 and a larger primary plasma source 1 further from the outlet 14, the arrangement including a guiding body 11 for guiding plasma generated by the primary plasma source 1 to the secondary plasma source 25 to stabilize plasma formation by the secondary plasma source 25.

Figure 6:
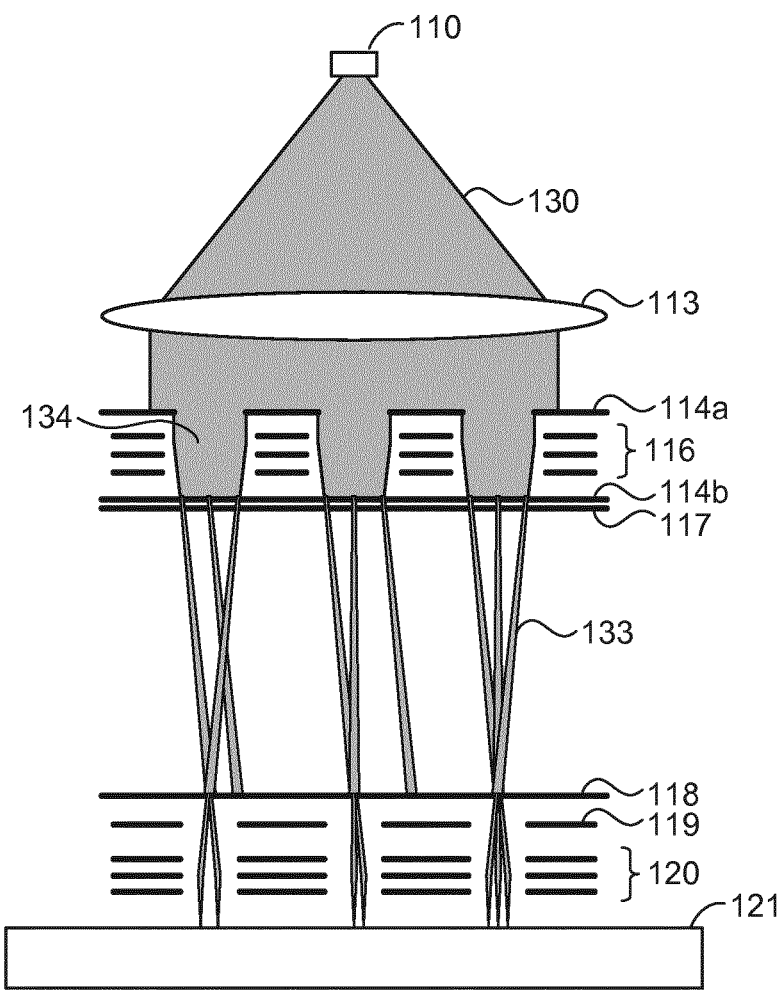
FIG. 6 is a schematic diagram of an embodiment of a charged particle lithography machine.

FIG. 6 shows a simplified schematic diagram of an electron-optical column of a charged particle lithography element. Such lithography systems are described for example in U.S. Pat. Nos. 6,897,458; 6,958,804; 7,019,908; 7,084,414; and 7,129,502, U.S. patent publication no. 2007/0064213, and co-pending U.S. patent application Nos. 61/031,573; 61/031,594; 61/045,243; 61/055,839; 61/058,596; and 61/101,682, which are all assigned to the owner of the present invention and are all hereby incorporated by reference in their entireties.

In the embodiment shown in FIG. 6, the lithography element column comprises an electron source 110 producing an expanding electron beam 130, which is collimated by collimator lens system 113. The collimated electron beam impinges on an aperture array 114a, which blocks part of the beam to create a plurality of sub-beams 134, which pass through a condenser lens array 116 which focuses the sub-beams. The sub-beams impinge on a second aperture array 114b which creates a plurality of beamlets 133 from each sub-beam 134. The system generates a very large number of beamlets 133, preferably about 10,000 to 1,000,000 beamlets.

A beamlet blanker array 117, comprising a plurality of blanking electrodes, deflects selected ones of the beamlets. The undeflected beamlets arrive at beam stop array 118 and pass through a corresponding aperture, while the deflected beamlets miss the corresponding aperture and are stopped by the beam stop array. Thus, the beamlet blaker array 117 and beam stop 118 operate together to switch the individual beamlets on and off. The undeflected beamlets pass through the beam stop array 119, and through a beam deflector array 119 which deflects the beamlets to scan the beamlets across the surface of target or substrate 121. Next, the beamlets pass through projection lens arrays 120 and are projected onto substrate 121 which is positioned on a moveable stage for carrying the substrate. For lithography applications, the substrate usually comprises a wafer provided with a charged-particle sensitive layer or resist layer.

The lithography element column operates in a vacuum environment. A vacuum is desired to remove particles which may be ionized by the charged particle beams and become attracted to the source, may dissociate and be deposited onto the machine components, and may disperse the charged particle beams. A vacuum of at least $10^{-6}$ bar is typically required. In order to maintain the vacuum environment, the charged particle lithography system is located in a vacuum chamber. All of the major elements of the lithography element are preferably housed in a common vacuum chamber, including the charged particle source, projector system for projecting the beamlets onto the substrate, and the moveable stage.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

What is claimed is:

1. An arrangement for generating plasma, the arrangement comprising:
   a primary plasma source comprising a primary source chamber and a first coil for generating plasma in the primary source chamber;
   a secondary plasma source comprising a secondary source chamber and a second coil for enhancing plasma generated by the primary plasma source and/or generating plasma in the secondary source chamber;
   a hollow guiding body arranged for guiding at least a portion of the plasma Generated by the primary plasma source to the secondary plasma source; and
   an outlet for emitting at least a portion of the plasma or components thereof Generated by the arrangement;
   wherein the secondary source chamber is smaller than the primary source chamber, wherein the secondary source chamber has a relatively small cross-sectional area in comparison with the primary source chamber, and wherein the secondary plasma source is arranged for operation at a lower power than the primary plasma source.

2. The arrangement of claim 1, wherein the secondary source chamber occupies at least a portion of the guiding body.

3. The arrangement according to claim 1, wherein the first coil of the primary plasma source and the second coil of the secondary plasma source are RF coils arranged to operate at a radio frequency voltage.

4. The arrangement according to claim 1, further comprising an electrode located near the outlet of the arrangement, wherein, in operation, the coil of the primary plasma source is capacitively coupled to the electrode via the plasma generated by the primary plasma source and/or the secondary plasma source.

5. The arrangement of claim 1, further comprising a pressure regulator for regulating pressure in the primary source chamber, and wherein a flow restriction is provided between the primary and secondary source chambers.

6. The arrangement according to claim 1, wherein the secondary source chamber has a length longer than the primary source chamber in a direction of the flow of plasma from the primary source chamber.

7. The arrangement according to claim 1, formed as a cleaning apparatus for cleaning contaminants from a surface, the apparatus comprising the guiding body having a bend or elbow for directing the plasma onto the surface to be cleaned.

8. The arrangement according to claim 1, wherein the hollow guiding body comprises a funnel section located at an outlet of the primary plasma source arranged for guiding plasma generated by primary plasma source into the guiding body.

9. The arrangement according to claim 1, wherein the guiding body comprises a quartz material or has an inner surface comprising a quartz material.

10. The arrangement according to claim 1, wherein the guiding body is in the form of a tube or duct.

11. The arrangement according to claim 1, wherein the guiding body has a bend or elbow to direct plasma from the outlet onto an area to be cleaned by the plasma.

12. The arrangement according to claim 1, the arrangement further comprising an aperture plate positioned between the primary source chamber and the guiding body and the aperture plate having one or more apertures for permitting flow of the plasma from the primary source chamber into the guiding body.

13. The arrangement according to claim 1, further comprising an aperture plate at or near the outlet of the guiding body to confine at least a portion of the plasma in the guiding body from exiting through the outlet.

14. A method for generating a plasma, comprising:
   flowing an input gas into a primary source chamber,
   energizing a first coil to form a primary plasma in the primary source chamber,
   flowing at least a portion of the primary plasma into a secondary source chamber, which is smaller than the primary source chamber, wherein the secondary source chamber has a relatively small cross-sectional area in comparison with the primary source chamber,
   energizing a second coil to enhance the primary plasma flowing from the primary source chamber and/or generate a secondary plasma in the secondary source chamber wherein the second coil is energized at a lower power than the first coil, and
   stabilizing the formation of plasma in the secondary source chamber with the primary plasma flowing from the primary source chamber.

15. The method of claim 14, wherein flowing the primary plasma into the secondary source chamber comprises:
   flowing the plasma into a guiding body, at least a portion of the guiding body forming the secondary source chamber.

16. The method of claim 14, wherein the first plasma is flowed from the primary source chamber through a restriction into a secondary source chamber.

17. The method according to claim 14, further comprising:
   maintaining a lower pressure in the secondary source chamber than in the primary source chamber.

18. A charged particle lithography machine, comprising a beamlet generator for generating a plurality of charged particle beamlets and a plurality of beamlet manipulator elements for manipulating the beamlets, each beamlet manipulator element comprising a plurality of apertures through which the beamlets pass, the machine further comprising an arrangement according to claim 1 adapted to generate plasma and direct the plasma onto a surface of one or more of the beamlet manipulator elements.

19. The arrangement according to claim 1, wherein the secondary source chamber is arranged to stabilize the formation of plasma with the plasma generated by the primary source chamber.

* * * * *